(12) United States Patent
Yu et al.

(10) Patent No.: US 6,261,960 B1
(45) Date of Patent: Jul. 17, 2001

(54) HIGH DENSITY CONTACTS HAVING RECTANGULAR CROSS-SECTION FOR DUAL DAMASCENE APPLICATIONS

(75) Inventors: Allen S. Yu, Fremont; Bharath Rangarajan, Santa Clara; Paul J. Steffan, Elk Grove, all of CA (US)

(73) Assignee: Advanced Micro Devices, Inc, Sunnyvale, CA (US)

( * ) Notice: Subject to any disclaimer, the term of this patent is extended or adjusted under 35 U.S.C. 154(b) by 0 days.

(21) Appl. No.: 09/545,698

(22) Filed: Apr. 6, 2000

(51) Int. Cl.$^7$ .................................................. H01L 21/00
(52) U.S. Cl. ......................... 438/692; 216/38; 438/737; 438/740; 438/745
(58) Field of Search ................................ 438/692, 693, 438/720, 723, 724, 725, 735, 737, 740, 743, 744, 745, 754, 756, 757; 216/38, 88, 89

(56) References Cited

U.S. PATENT DOCUMENTS

| | | | |
|---|---|---|---|
| 5,262,354 | * 11/1993 | Cote et al. | 438/692 X |
| 6,121,145 | * 9/2000 | Huang | 438/692 |
| 6,121,145 | * 9/2000 | Huang | 438/692 |
| 6,150,272 | * 11/2000 | Liu et al. | 438/692 |
| 6,165,899 | * 12/2000 | Matumoto | 438/725 |
| 6,194,313 | * 2/2001 | Singh et al. | 438/692 X |

* cited by examiner

Primary Examiner—William Powell
(74) Attorney, Agent, or Firm—H. Donald Nelson

(57) ABSTRACT

A method of manufacturing a semiconductor device having rectangular cross-sectional interfaces between a conductive line and a conductive via. A first layer of photoresist is patterned to expose portions of the semiconductor device under which conductive wires and combination conductive wires and vias are to be formed. A second layer of photoresist is patterned to expose portions of the semiconductor device under which combination conductive wires and vias are to be formed. A second layer of interlayer dielectric in which conductive wires are to be formed and a first layer of interlayer dielectric in which conductive vias are to be formed are simultaneously anisotropically etched to form cavities, which are simultaneously filled with a conductive material.

4 Claims, 10 Drawing Sheets

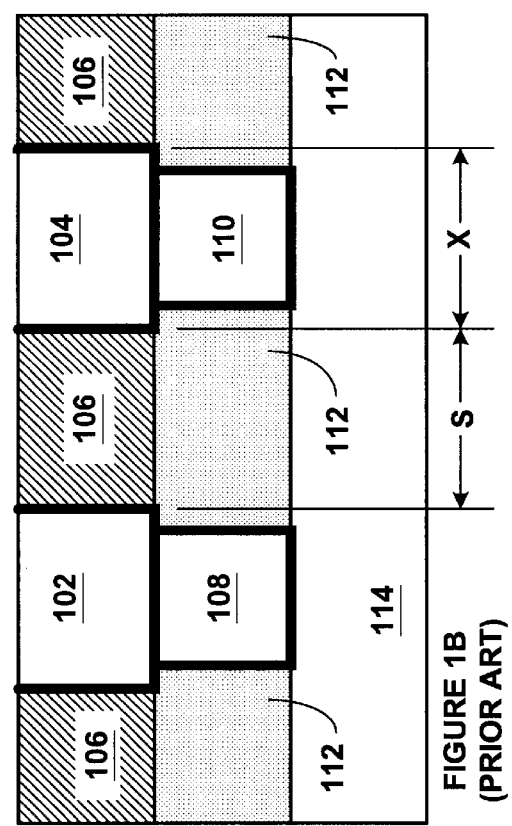
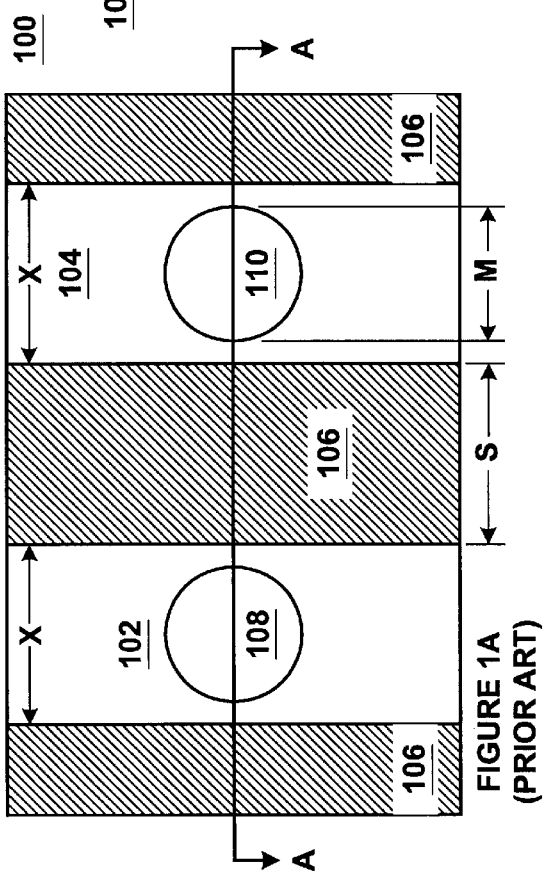
FIGURE 1A (PRIOR ART)
FIGURE 1B (PRIOR ART)
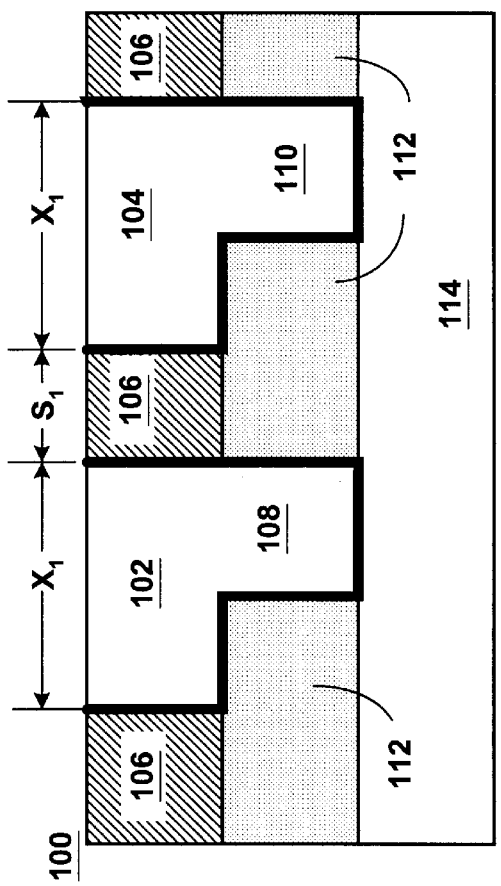
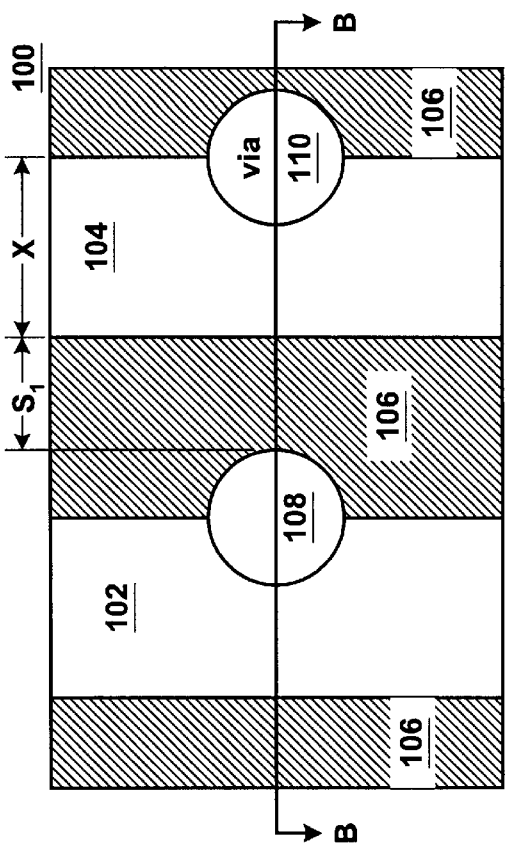
FIGURE 2A (PRIOR ART)
FIGURE 2B (PRIOR ART)

HIGH DENSITY CONTACTS HAVING RECTANGULAR CROSS-SECTION FOR DUAL DAMASCENE APPLICATIONS

BACKGROUND OF THE INVENTION

1. Field of the Invention

This invention relates generally to a method of manufacturing semiconductor devices containing conductive line and conductive via interconnection structures. More specifically, this invention relates to a dual damascene method of manufacturing semiconductor devices containing conductive line and conductive via interconnection structures. Even more specifically, this invention relates to a dual damascene method of manufacturing semiconductor devices having high-density rectangular cross-section contacts that avoids the effects of mask misalignment during manufacturing.

2. Discussion of the Related Art

As the prices of semiconductor devices continue to plummet, more components and more complex components are incorporated into devices to extend their performance and functionality and thus to maintain their price and profitability. However, increased performance and functionality requires greater density and increased transistor counts, which in turn requires more interconnections and increased layers to accommodate the increased number of interconnections.

Traditional etchback methods to provide interconnection structures include a single damascene method. Although the single damascene method offers the advantage of improved planarization, it is however, time consuming in that it requires numerous processing steps. Also, an interface film is required between the conductive via and conductive wiring, which increases the via resistance and lowers the performance of the device.

Another cost reduction method is to build the device in the shortest time and with the fewest process steps as possible. The reduction in process steps also reduces random killer defects on the wafer resulting in higher yields. One such technique to reduce process steps is the employment of a dual damascene technique in which both the conductive via plugs and the conductive wiring line is filled in a single process step after the conductive vias and conductive wire trenches cavities have been made. The excess conductive material is then removed by using one of several well-known processes, such as the CMP (chemical mechanical polishing) process. The dual damascene technique is an improvement over the single damascene technique because it permits the filling of both the conductive lines and conductive vias with metal at the same time, with only one interface film, thereby eliminating process steps and at the same time decreasing overall contact/via resistance.

IBM developed the dual damascene technique. See, for example, Joshi, "A New Damascene Structure for Submicrometer Interconnect Wiring," IEEE Electron Letters, vol. 14, No. 3, March 1993, pages 129–132; and Kaanta et al., "Dual Damascene: A ULSI Wiring Technology," Jun. 11–12, 1991, VMIC Conference, IEEE, pages 144–152. The use of a damascene technique wherein the dielectric is planarized by chemical-mechanical polish is discussed in Kenny et al., "A Buried-Plate Trench Cell for a 64-Mb DRAM," 1992 Symposium on VLSI Technology Digest of Technical Papers, IEEE, pages 14 and 15. U.S. Pat. No. 5,262,354 discloses a three-step method of forming electrical conductive vias and lines involving a damascene technique to create lines on a substrate and, in addition, this patent discloses the advantages of chemical-mechanical polishing with aluminum slurry in dilute nitric acid to planarize a dielectric surface. U.S. Pat. No. 5,093,279 discloses a laser ablation damascene process for planarizing metal/polymer structures in the fabrication of both interlevels via metallization and circuitization layers in integrated circuit interconnects.

The dual damascene technique involves the simultaneous formation of a structure comprising a conductive via and a conductive line, thereby requiring fewer manipulative steps than the single damascene technique and eliminating the interface between the conductive via and conductive line, which is necessarily formed by the single damascene technique.

Although dual damascene offers advantages over other processes for forming interconnections, it has a number of disadvantages. One disadvantage is that the typical dual damascene technique requires two masking steps to form the pattern, the first masking delineates the dimensions and shape of the conductive vias and the second masking step delineates the dimensions and shape of the conductive lines or vice versa. These two masking steps require critical alignment to position the conductive via within the dimensions of trenches in which the conductive lines are formed. It is highly desirable to have the length dimension of the conductive via extend the full width dimension of the conductive line. However, because that would require more critical alignment of the two masks, the conductive via length dimension is typically designed to be slightly smaller than the width dimension of the conductive line in the standard dual damascene process. Therefore, conductive lines are typically designed to be wider than the width dimension of the conductive vias in order to correct for alignment errors during manufacture. The requirement to have wider conductive lines results in a density reduction in a fixed silicon area. This suggests that the conductive vias are being printed at the minimum printable size while the lines are being printed larger than the minimum printable size. This results in the feature size not being laid out to maximize density efficiency per given surface area, thus requiring more layers of multi-level interconnection. All these factors negatively impact cost, yield and cycle time.

In addition, because the conductive vias are being printed at the minimum printable size and as is well known in the semiconductor manufacturing art, even though the mask (chrome) for the vias are square, because of lithographic techniques, the actual vias (resist pattern) have a circular cross-section because the corners of the vias become rounded. This rounding of the corners can result in a round via and the round via having a given diameter "d" has a cross-sectional area that is less than the cross-sectional area of a square via having the same length and width dimension "d". The reduced cross-sectional area of the round via has an increased resistance at the interface between the round conductive via and the conductive wire.

Therefore, what is needed is an improved dual damascene technique that produces a rectangular cross-sectional interface between a conductive via and a conductive line and that provides the conductive via width to extend the full dimension of the conductive line and no further in order to achieve the maximum electrical contact between the conductive line and the conductive via and to achieve the greatest density possible in the semiconductor device.

DISCLOSURE OF THE INVENTION

According to the present invention, the foregoing and other objects and advantages are attained by a method of manufacturing a semiconductor device having rectangular cross-sectional interfaces between a conductive line and a conductive via.

In accordance with an aspect of the invention, a first layer of photoresist is patterned to expose portions of the semiconductor device under which conductive wires and combination conductive wires and vias are to be formed. A second layer of photoresist is patterned to expose portions of the semiconductor device under which combination wires and vias are to be formed. A second layer of interlayer dielectric in which conductive wires are to be formed and a first layer of interlayer dielectric in which conductive vias are to be formed are simultaneously anisotropically etched to form cavities that are simultaneously filled with a conductive material.

In accordance with another aspect of the invention, the first layer of photoresist is patterned with a dimension X that is a dimension of the conductive lines and conductive vias. The second layer of photoresist is patterned with a dimension X+a, where the dimension "a" is selected to compensate for a misalignment of the first layer of photoresist and to compensate for rounding of corners of etched portion of the stop layer to achieve rectangular cross-sectional interface between the conductive wires and conductive vias.

The described method thus provides a method to manufacture semiconductor devices that have the maximum density and that have the maximum interface area between conductive wires and conductive vias.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

FIG. 1A is a top view of a portion of a prior art semiconductor device having multi-level interconnections showing vias aligned with associated conductive lines;

FIG. 1B is a cross-sectional view indicated by AA in FIG. 1A;

FIG. 2A is a top view of the prior art semiconductor device shown in FIG. 1A showing the vias misaligned with the associated conductive lines;

FIG. 2B is a cross-sectional view indicated by BB in FIG. 2A;

FIGS. 3A–3P illustrate a method of manufacturing a semiconductor device in accordance with the present invention, wherein:

FIG. 3A shows a portion of a semiconductor device during manufacture with a first layer of interlayer dielectric formed on a previous structure or substrate, an etch stop layer formed on the first layer of interlayer dielectric, a second layer of interlayer dielectric formed on the etch stop layer, a layer of hard mask formed on the second layer of interlayer dielectric and a first layer of photoresist formed and patterned on the layer of hard mask material exposing portions of the layer of hard mask material;

FIG. 3P is a top view of the portion of the semiconductor device as shown in FIG. 3O.

DETAILED DESCRIPTION

Figure 2C:
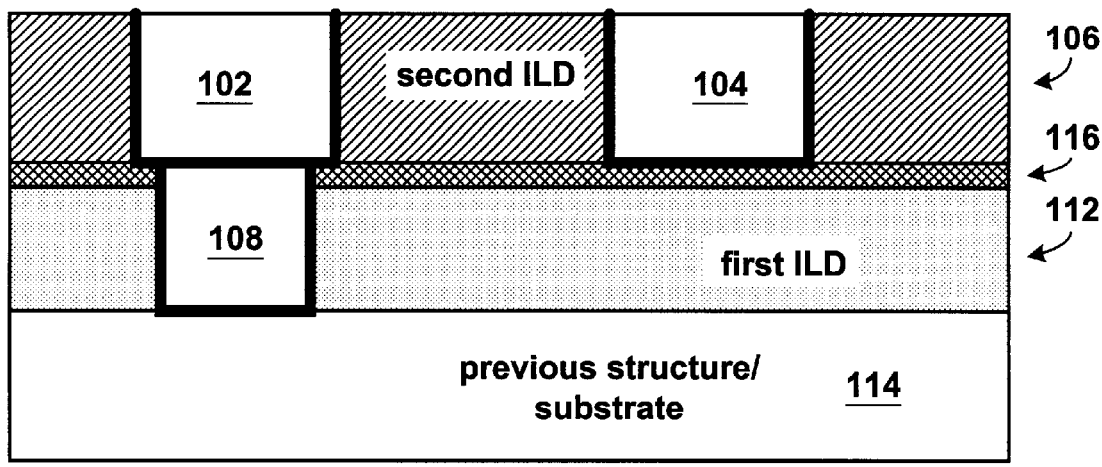
FIG. 2C shows a cross sectional view of interconnections from a typical semiconductor device manufactured by a "self-aligning via" dual damascene method where a previously patterned via stop layer is buried under a second layer of an interlevel dielectric material.

Reference is now made in detail to a specific embodiment of the present invention that illustrates the best mode presently contemplated by the inventors for practicing the invention.

FIG. 1A is a top view of a portion of a prior art semiconductor device 100 showing a first conductive line cavity 102 and a second conductive line cavity 104 each having a width X and separated by an interlayer dielectric 106 having a width S. The dimensions X and S are selected in order to provide the maximum density that is possible considering that the designed via dimension in prior art devices has been decreased to allow for misalignment, as discussed above. The selection criteria of the dimensions X and S include various factors such as electrical characteristics. A first via cavity 108 is formed having an interface with the conductive line cavity 102 and a second via cavity 110 is formed having an interface with the conductive line 104.

FIG. 1B is a cross sectional view indicated by section AA in FIG. 1A of the prior art semiconductor device 100. The cross sectional view shown in FIG. 1B shows the relationship between the conductive line cavities 102 and 104 and via cavities 108 and 110. The conductive line cavities are formed in the interlayer dielectric 106 and the via cavities are formed in a first interlayer dielectric layer 112. The first interlayer dielectric layer 112 is formed on a previous structure/substrate 114. As can be seen in FIG. 1B, when the via mask and the conductive line mask are properly aligned, the dimensions S and X are maintained. Also, as discussed above, because the dimensions of the via have been decreased to allow for misalignment of the via mask and the wire mask (the dimension M is less than the dimension X), the cross-sectional electrical interface area between the conductive via and the conductive wire is less than the maximum possible, that is, when dimension M equals dimension X and the via and wire are aligned. Because the cross-sectional electrical interface has been decreased the resistance at the interface has been increased. As is known in the semiconductor art, the previous structure may be a previous metal layer and the substrate may be a layer in and on which active devices have been formed. The vias connect electrodes in the active devices to other electrodes in other portions of the semiconductor device by forming an electrical connection between the electrode in the substrate and another electrode via the conductive lines.

FIG. 2A is a top view of the portion of a prior art semiconductor device 100 as shown in FIG. 1A with the conductive line cavities 102 and 104 misaligned with the conductive via cavities 108 and 110. The distance between the conductive elements, for example distance between conductive via cavity 108 and conductive line cavity 104 is now $S_1$ rather than S as designed. The diminished distance $S_1$ detrimentally affects the electrical characteristics of the device and therefore decreases the reliability of the semiconductor device. In addition, the width of the conductive line cavities 102 and 104 has been increased to $X_1$.

Figure 2D:
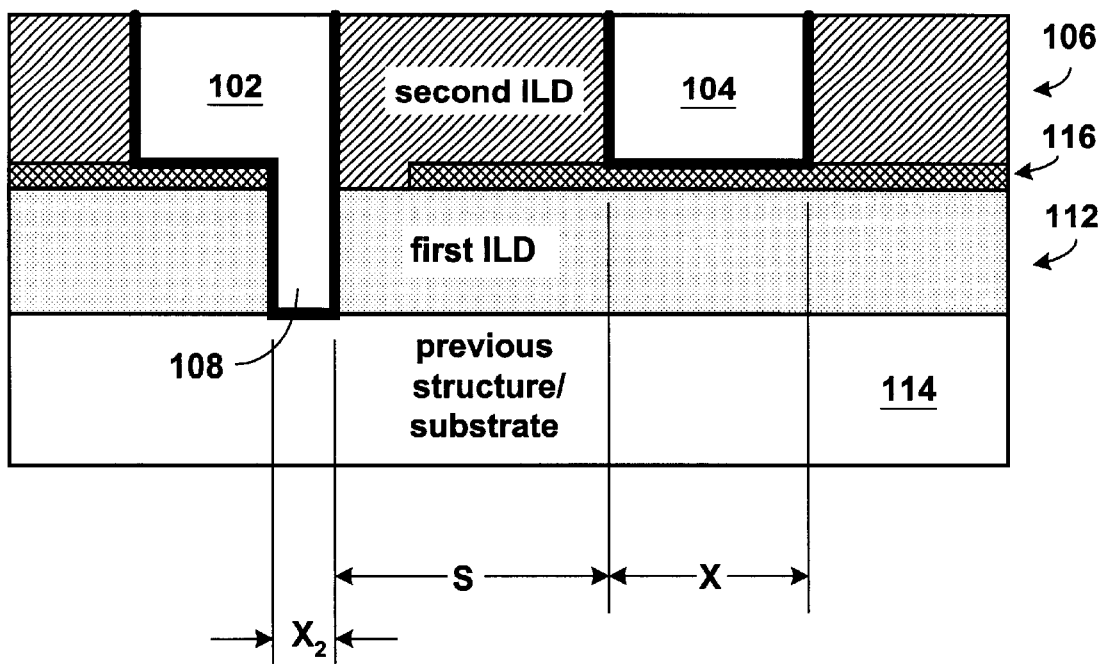
FIG. 2D shows the effect of a misalignment of the via mask and the wire mask during the manufacture of the semiconductor device shown in FIG. 2C.

FIGS. 2C and 2D illustrate a prior art method of preventing the width of the conductive lines from increasing. However, as will be seen the dimensions of the conductive vias can decrease. The prior art method involves forming and patterning a via stop layer 116 between the first layer of interlayer dielectric (ILD) 112 and the second layer of interlayer dielectric (ILD) 106. The conductive line 102 in FIG. 2C is shown aligned with via 108.

FIG. 2D illustrates the results when the conductive line cavity 102 is not properly aligned with via cavity 108. The pattern in the stop layer 116 corrects for a certain amount of misalignment, however when the misalignment exceeds a limit as shown in FIG. 2D the via has a width of $X_2$.

Figure 3A:
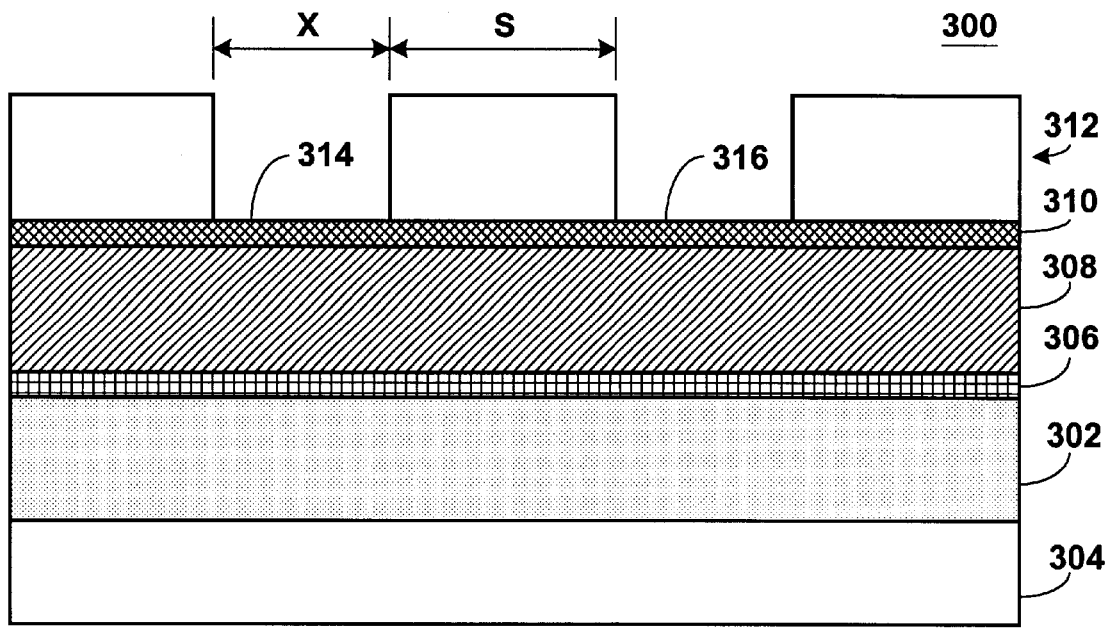
Figure 3B:
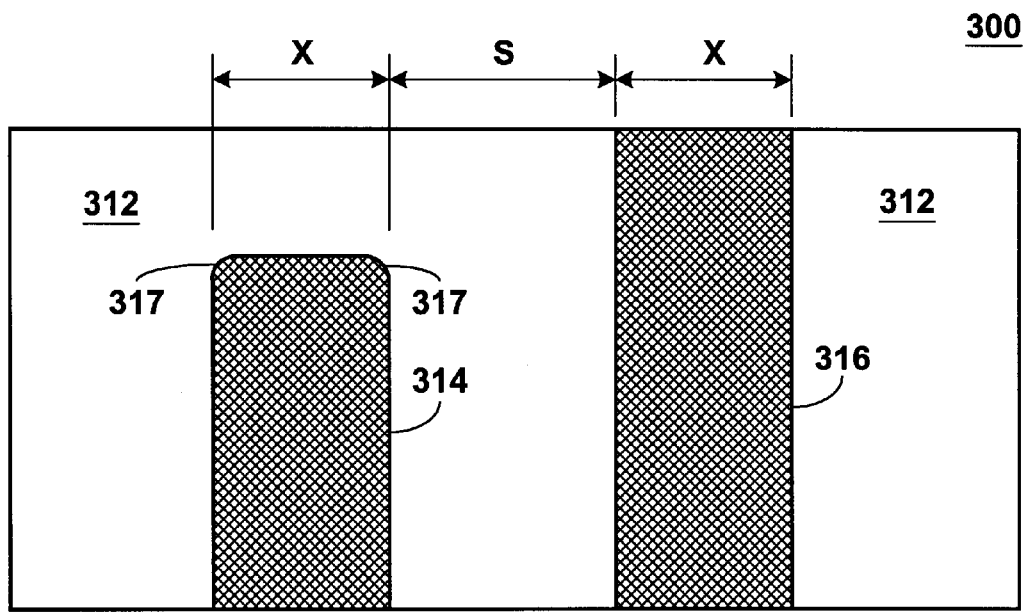
FIG. 3B is a top view of the portion of the semiconductor device shown in FIG. 3A.
Figure 3C:
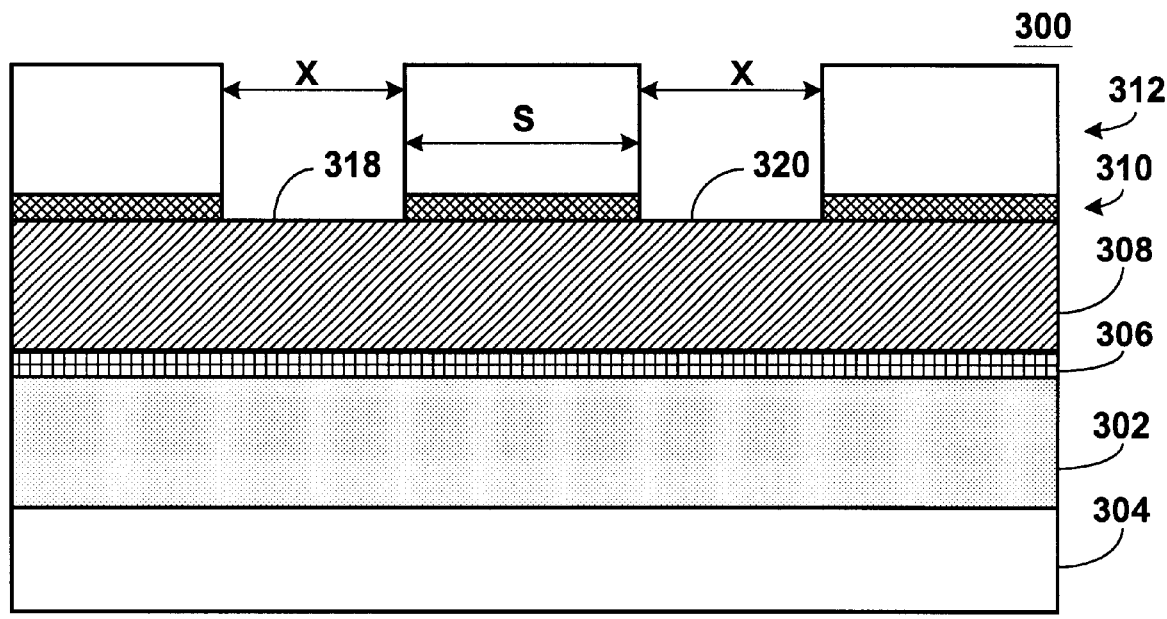
FIG. 3C shows the portion of a semiconductor device as shown in FIG. 3B with the exposed portions of the layer of hard mask material removed exposing portions of the second layer of interlayer dielectric.
Figure 3D:
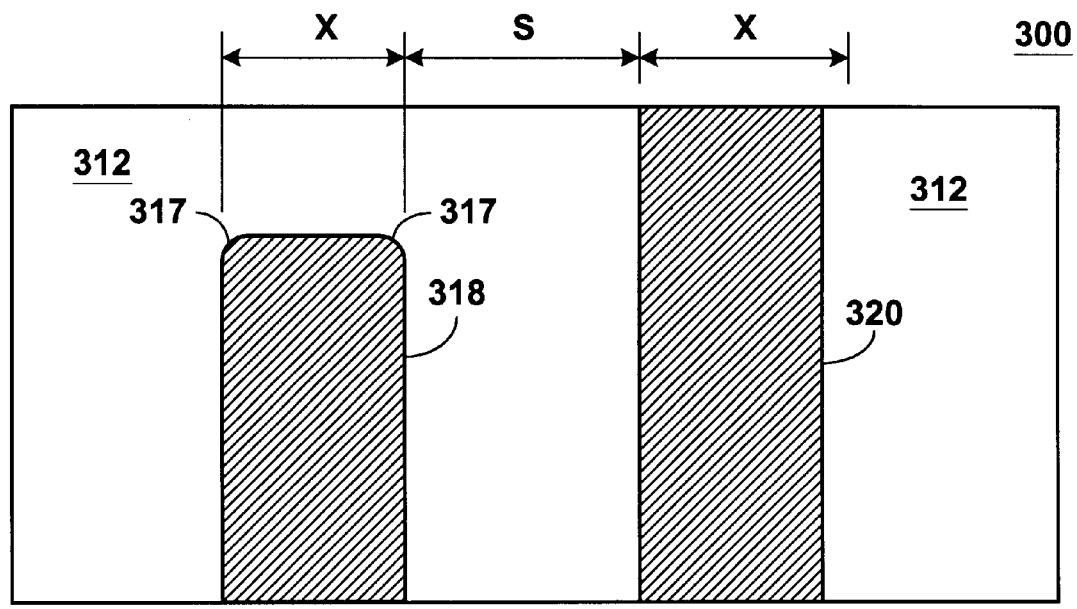
FIG. 3D is a top view of the portion of the semiconductor device shown in FIG. 3C.
Figure 3E:
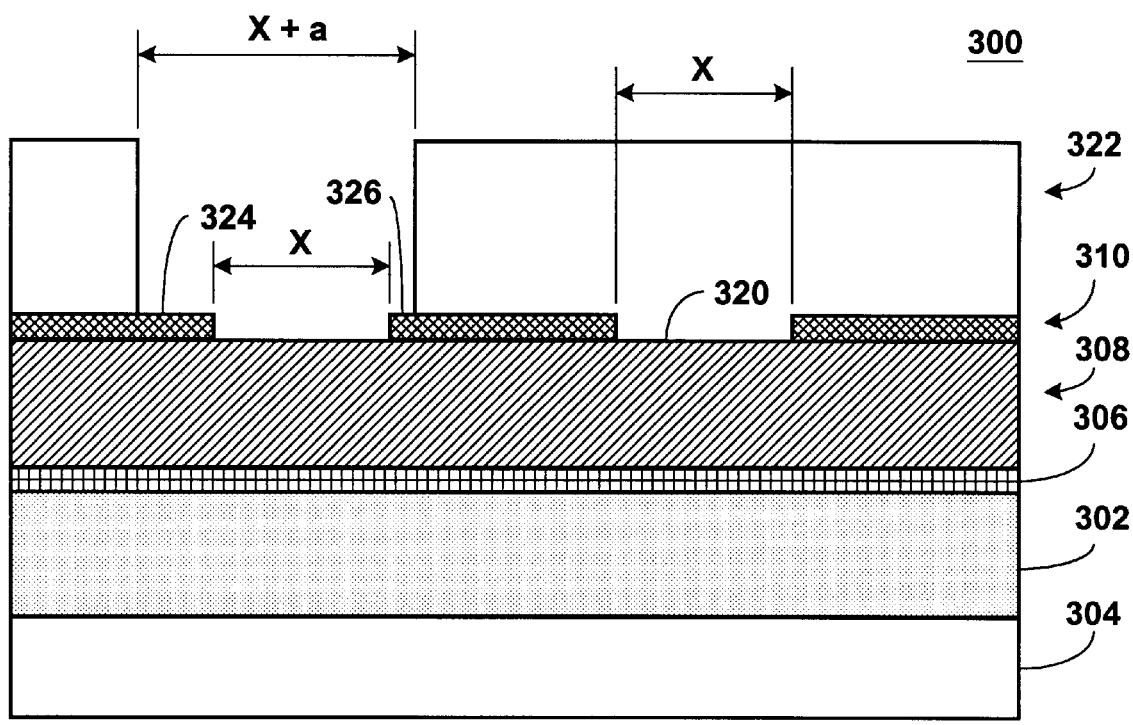
FIG. 3E shows the portion of a semiconductor device as shown in FIG. 3C with the first layer of photoresist removed and a second layer of photoresist formed and patterned exposing a portion of the semiconductor device under which a combination wire and conductive via is to be formed.
Figure 3F:
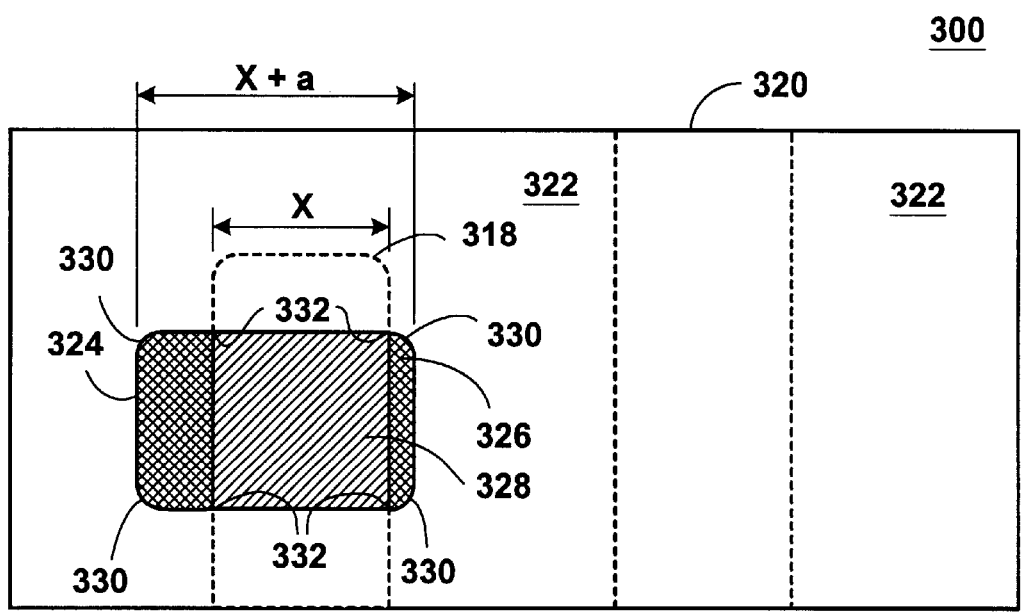
FIG. 3F is a top view of the portion of the semiconductor device shown in FIG. 3E.
Figure 3G:
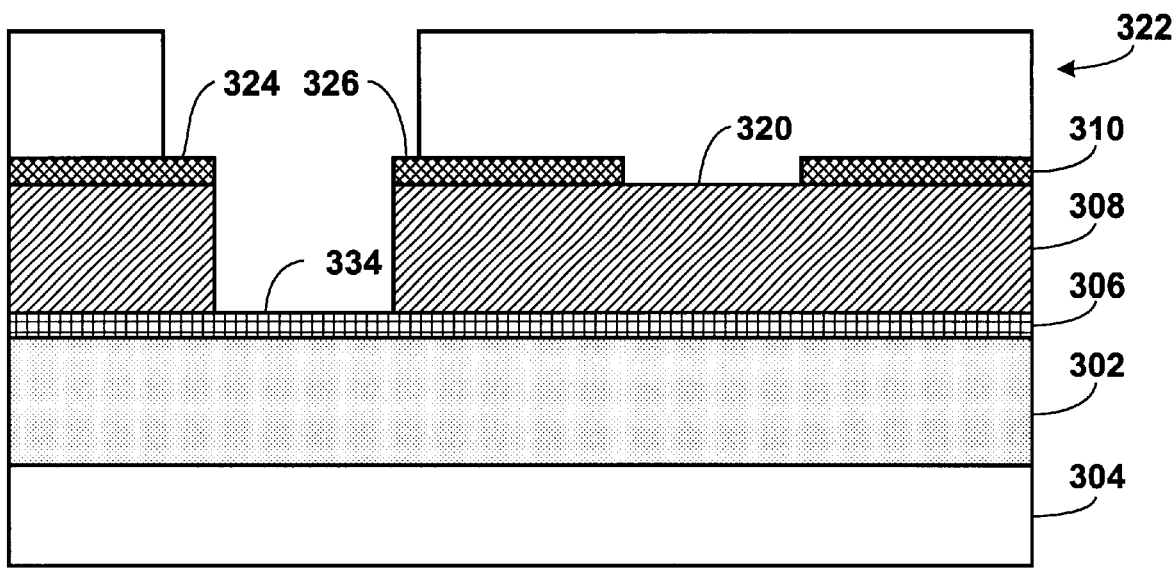
FIG. 3G shows the portion of a semiconductor device as shown in FIG. 3E with the exposed portion of the second layer of interlayer dielectric removed exposing a portion of the etch stop layer.
Figure 3H:
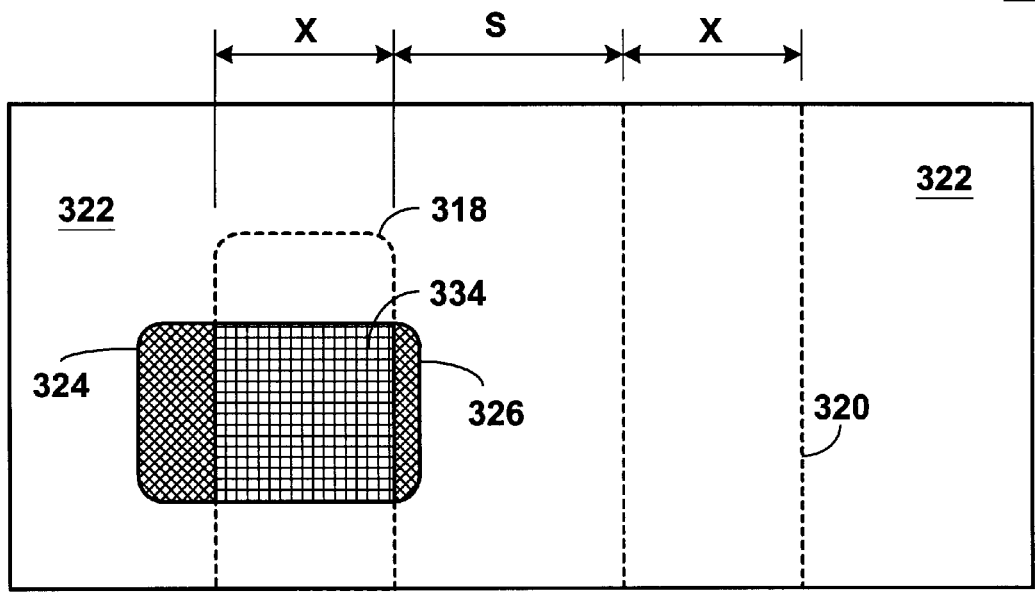
FIG. 3H is a top view of the portion of the semiconductor device shown in FIG. 3G.
Figure 3I:
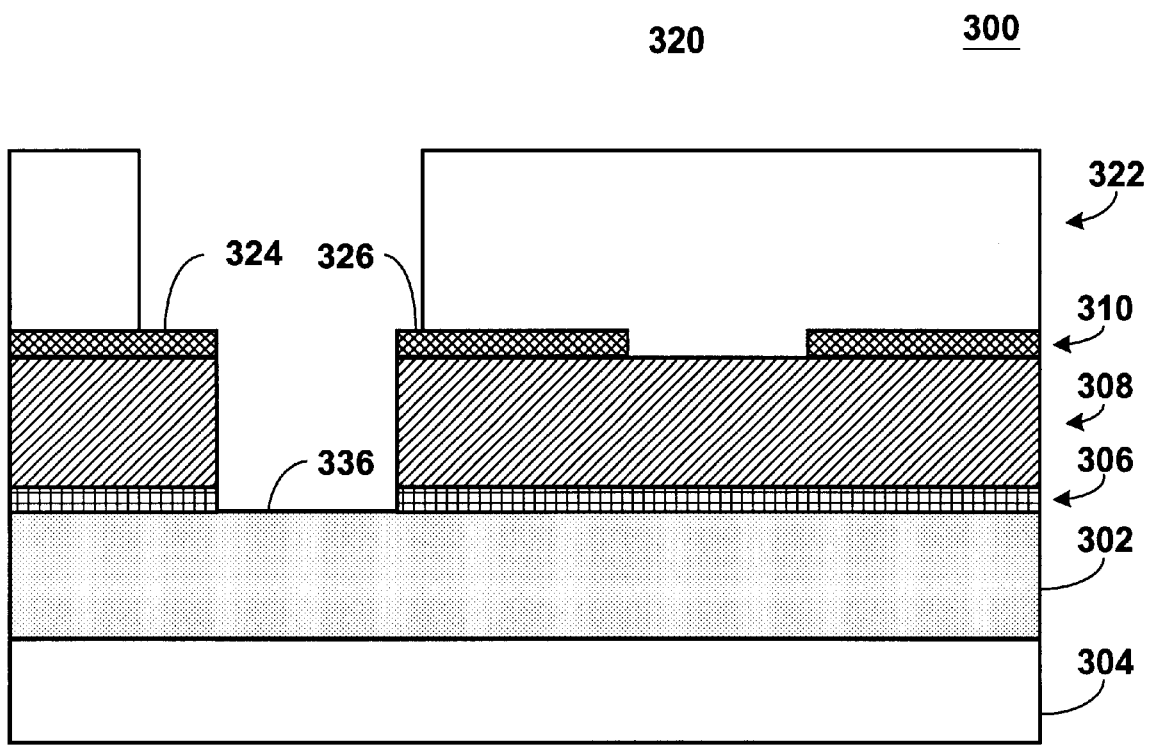
FIG. 3I shows the portion of a semiconductor device as shown in FIG. 3I with the exposed portion of the etch stop layer removed exposing a portion of the first layer of interlayer dielectric in which a conductive via is to be formed.
Figure 3J:
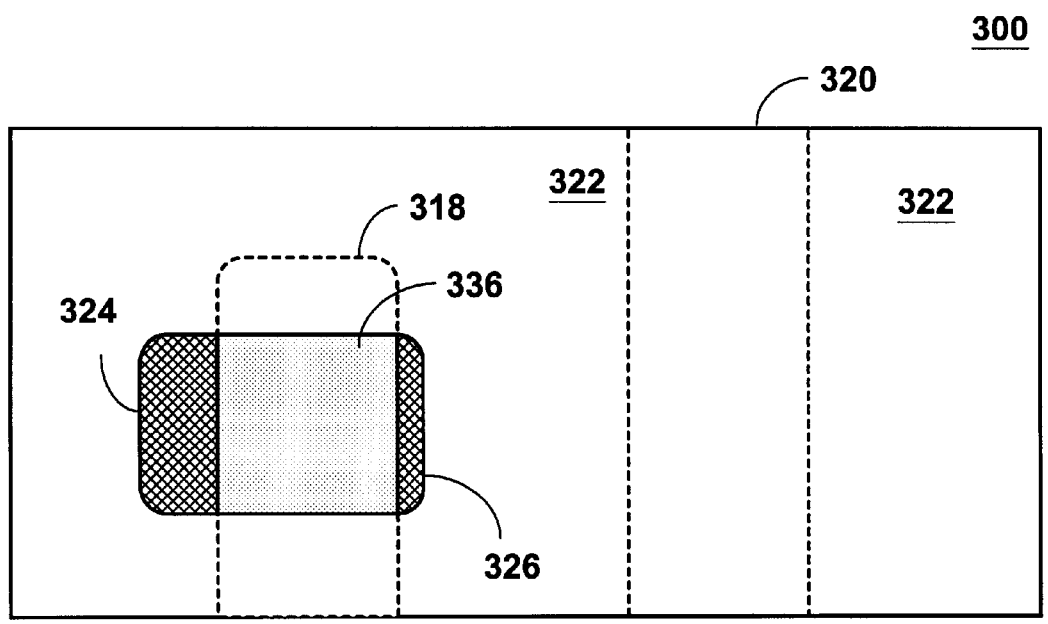
FIG. 3J is a top view of the portion of the semiconductor device shown in FIG. 3I.
Figure 3K:
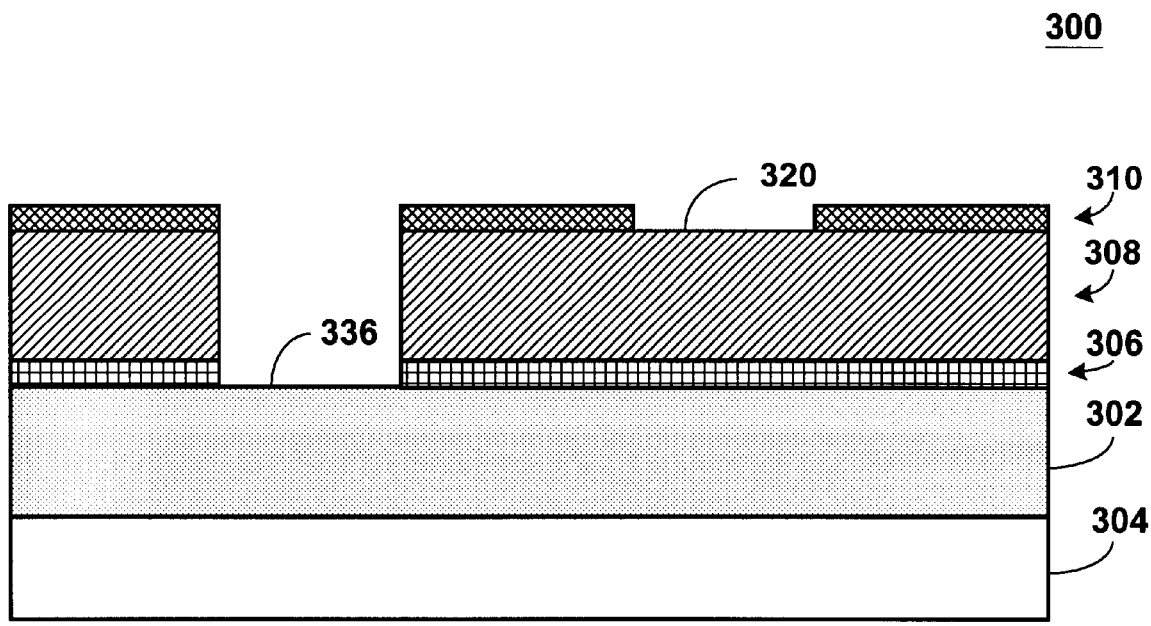
FIG. 3K shows the portion of a semiconductor device as shown in FIG. 3I with the second layer of photoresist removed exposing a portion of the first layer of interlayer dielectric in which a combination wire/via cavity is to be formed and a portion of the second layer of interlayer dielectric in which a wire cavity is to be formed.
Figure 3L:
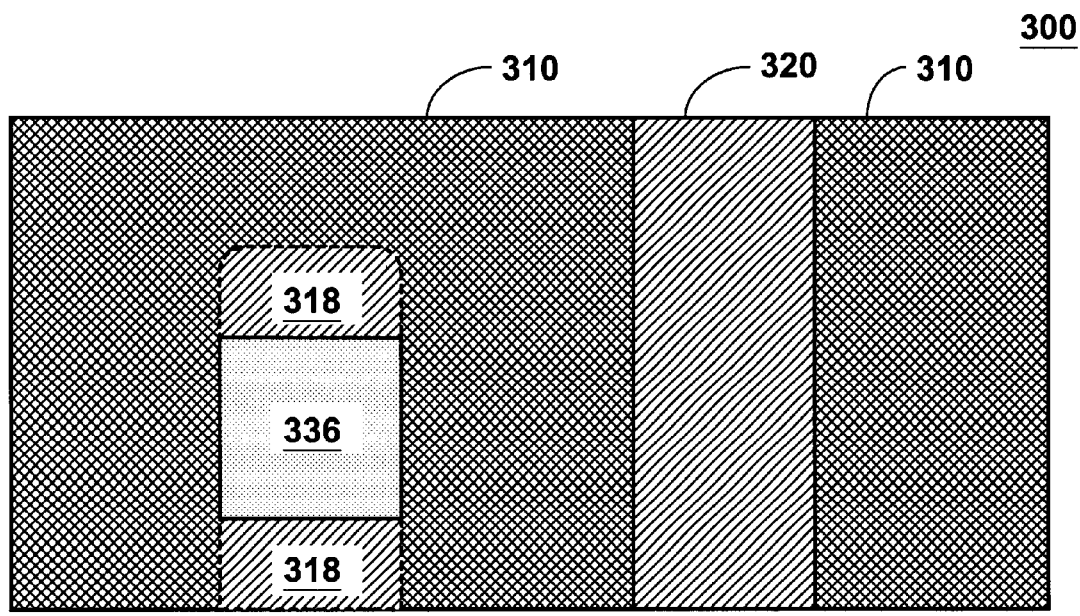
FIG. 3L is a top view of the portion of the semiconductor device as shown in FIG. 3K.
Figure 3M:
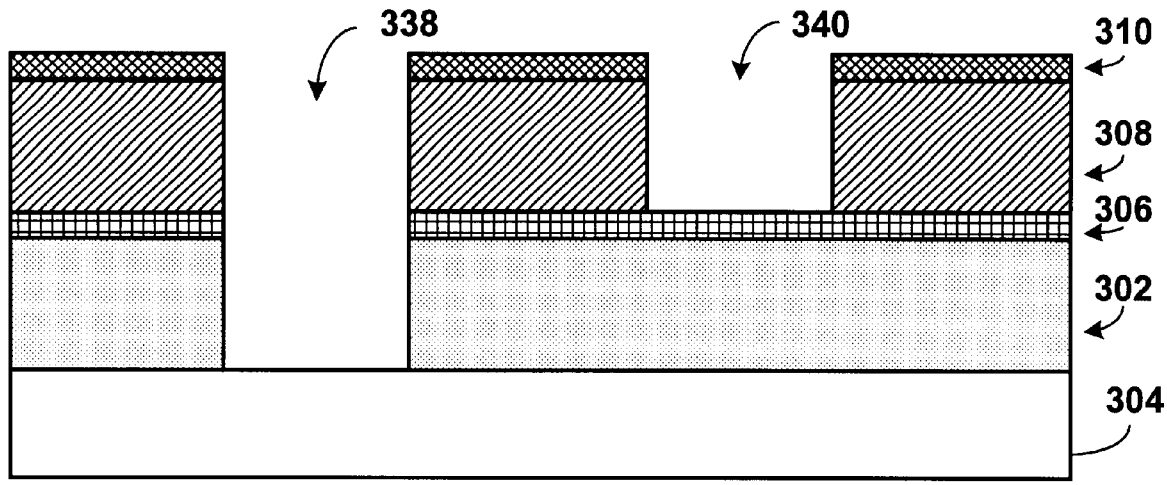
FIG. 3M shows the portion of a semiconductor device as shown in FIG. 3K with the exposed portion of the first layer of interlayer dielectric removed forming a combination conductive wire/via cavity and with the exposed portion of the second layer of interlayer dielectric removed forming a conductive wire cavity.
Figure 3N:
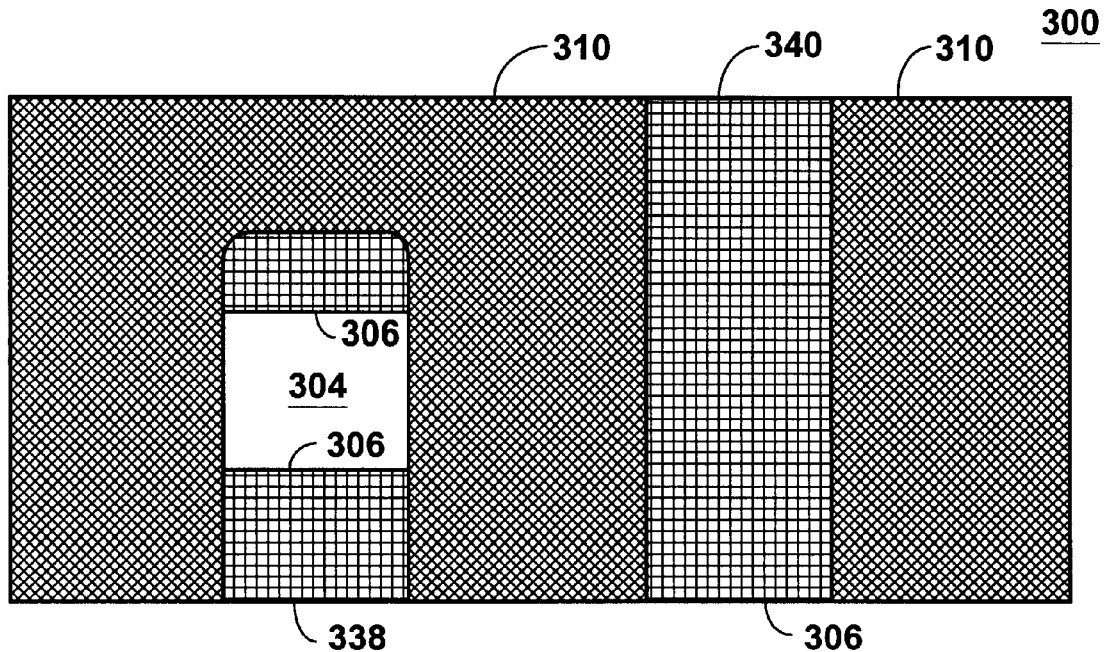
FIG. 3N is a top view of the portion of the semiconductor device as shown in FIG. 3M.
Figure 3O:
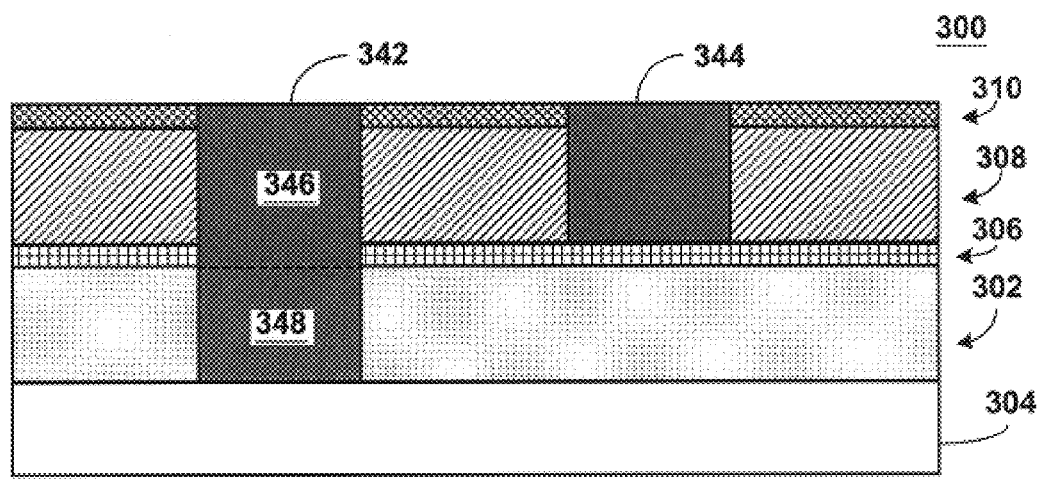
FIG. 3O shows the portion of a semiconductor device as shown in FIG. 3M with the combination conductive wire/via cavity and wire cavity filled with a conductive material.
Figure 3P:
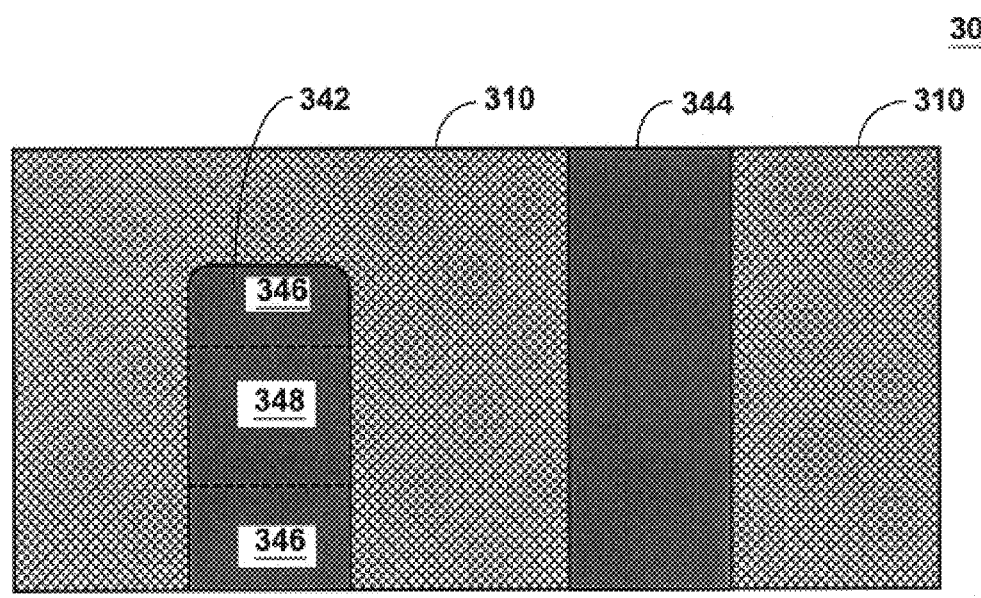

FIGS. 3A–3P illustrate a method of manufacturing a semiconductor device in accordance with the present invention.

FIG. 3A shows a portion 300 of a semiconductor device having a first layer 302 of interlayer dielectric formed on a previous structure or substrate 304 and an etch stop layer 306 formed on the first layer 302 of interlayer dielectric. A second layer 308 of interlayer dielectric is formed on the etch stop layer 306. The first layer 302 and the second layer 308 of interlayer are typically formed from BPSG or TEOS. The etch stop layer 306 is typically formed from oxynitride. A layer 310 of hard mask material is formed on the second layer 308 of interlayer dielectric. The layer 310 of hard mask material is typically formed from a metallic nitride material such as TiN. A first layer 312 of photoresist is formed on the layer 310 of hard mask material and patterned to expose portions 314 and 316 of the layer 310 of hard mask material. The pattern in the first layer 312 of photoresist includes a dimension X that is the designed width of conductive line cavities and via cavities and a dimension S that is the designed distance between adjacent conductive lines and/or adjacent conductive vias. In the present invention, because the dimension X is the dimension of both the conductive lines and conductive vias and because the conductive vias and lines are formed simultaneously, maximum electrical interface area will be achieved regardless of misalignment of the first mask and the second mask. In addition, because the dimension X is the dimension of both the conductive lines and conductive vias, it is not necessary to undersize the vias or oversize the lines to allow for misalignment. Because of this, the maximum density can be achieved by the method of the present invention.

FIG. 3B is a top view of the portion 300 of a semiconductor device shown in FIG. 3A and shows the pattern formed in the first layer 312 of photoresist showing the shape of the exposed portions 314 and 316 of the layer 310 of hard mask material. The exposed portions 314 and 316 are the shape of portions of conductive wires that will be formed in subsequent processes. The rounded corners 317 show how the corners of a pattern are rounded even though the pattern in the mask has square corners.

FIG. 3C shows the portion 300 of a semiconductor device as shown in FIG. 3A after an anisotropic etch procedure that removes the exposed portions 314 and 316 of the layer 310 of hard mask material exposing portions 318 and 320 of the second layer 308 of interlayer dielectric. It is noted that the removed portions 318 and 320 of the layer 310 of hard mask material have a dimension X separated by a dimension S. The portions 318 and 320 each have the shape of a portion of a conductive wire that will be formed in subsequent processes.

FIG. 3D is a top view of the portion 300 of a semiconductor device shown in FIG. 3C and shows the pattern formed in the layer 310 of hard mask showing the shape of the exposed portions 318 and 320 of the second layer 308 of interlayer dielectric.

FIG. 3E shows the portion 300 of a semiconductor device shown in FIG. 3C after the first layer 312 of photoresist has been removed and a second layer 322 of photoresist formed on the semiconductor device and patterned to expose portions of the underlying structure. The portions of the underlying structure that are exposed are portions of the underlying structure in which conductive vias are to be formed. The second layer 322 of photoresist has a pattern with a dimension X+a, where X is the desired dimension of the via and "a" is an arbitrary dimension selected so that the total dimension X+a formed by the second layer 322 of photoresist sufficiently beyond the dimension formed by the first layer 312 of photoresist so that a rectangular interface is formed between the conductive via and the conductive wire as illustrated in FIG. 3F. The pattern in the second layer 322 of photoresist exposes portions 324 and 326 of the layer 310 of hard mask and portion 318 of the second layer 308 of interlayer dielectric.

FIG. 3F is a top view of the portion 300 of a semiconductor device shown in FIG. 3E showing the shape of an exposed portion 328 of the second layer 308 of interlayer dielectric. It is noted that the exposed portion 328 of the second layer 308 is a portion of the previously exposed portion 318 of the second layer 308. The rounded corners 330 show how the corners of a pattern are rounded even though the pattern in the mask has square corners. It can be appreciated that the added dimension "a" to the dimension "X" allows the corners 332 of the pattern to be square. It is further noted that the mask for the second layer 322 of photoresist is misaligned so that portion 324 is greater than portion 326. A perfect alignment occurs when portion 324 is the same as portion 326.

FIG. 3G shows the portion 300 of a semiconductor device as shown in FIG. 3E after an anisotropic etch process removes the exposed portion 328 of the second layer 308 of interlayer dielectric exposing portion 334 of the etch stop layer 306.

FIG. 3H is a top view of the portion 300 of a semiconductor device shown in FIG. 3E showing the shape of the exposed portion 334 of the etch stop layer 306.

FIG. 3I shows the portion 300 of a semiconductor device as shown in FIG. 3G after anisotropic etch process removes the exposed portion 334 of the etch stop layer 306 exposing portion 336 of the first layer 302 of interlayer dielectric.

FIG. 3J is a top view of the portion 300 of a semiconductor device shown in FIG. 3I showing the shape of the exposed portion 336 of the first layer 302 of interlayer dielectric.

FIG. 3K shows the portion 300 of a semiconductor device shown in FIG. 3I after the second layer 322 of photoresist has been removed exposing portion 336 of the first layer 302 interlayer dielectric and portion 320 of the second layer 308 of interlayer dielectric.

FIG. 3L is a top view of the portion 300 of a semiconductor device shown in FIG. 3K showing the exposed portion 336 of the first layer 302 of interlayer dielectric and the exposed portion 320 of the second layer 308 of interlayer dielectric. Also exposed are portions 318 of the second layer 308 of interlayer dielectric.

FIG. 3M shows the portion 300 of a semiconductor device shown in FIG. 3K after an anisotropic etching process that removes the exposed portion 336 of the first layer 302 of interlayer dielectric and portion 320 and 318 of the second layer 308 of interlayer dielectric forming a combination conductive wire cavity 338 and a conductive wire cavity 340.

FIG. 3N is a top view of the portion 300 of a semiconductor device shown in FIG. 3M showing the exposed portion of the layer 306 of hard mask material making up cavity 340 and the exposed portion of the previous structure/ substrate 304 and exposed portions of the hard mask layer 306 maling up cavity 338.

FIG. 3O shows the portion 300 of a semiconductor device shown in FIG. 3M with the cavities 338 and 340 filled with a conductive material forming conductive structures 342 and 344. Portion 346 of conductive structure 342 is a portion of a conductive wire and portion 348 is a conductive via. The conductive structure 344 is a conductive wire.

FIG. 3P is a top view of the portion 300 of a semiconductor device shown in FIG. 3O showing the layer 310 of hard mask material and the conductive structures 342 and 344.

For purposes of brevity, the present application describes the manufacture of a wire structure and a single wire/via combination. However, it should be understood that the methods of the present invention are applicable to a chain of combination wire and via structures, that is combination wire and via structures side by side.

In summary, the results and advantages of the present invention are provided by a method to manufacture semiconductor devices that have the maximum density and that have the maximum interface area between conductive wires and conductive vias The foregoing description of the embodiment of the invention has been presented for purposes of illustration and description only. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing a semiconductor device having rectangular cross-section dual damascene structures, the method comprising:

(a) forming a first layer of an interlayer dielectric on a substrate in and on which active devices have been formed;

(b) forming an etch stop layer on the first layer of an interlayer dielectric;

(c) forming a second layer of an interlayer dielectric on the etch stop layer;

(d) forming a layer of hard mask material on the second layer of an interlayer dielectric;

(e) forming a first layer of photoresist on the layer of hard mask material;

(f) removing portions of the first layer of photoresist exposing portions of the layer of hard mask material under which conductive wires will be formed;

(g) anisotropically etching the exposed portions of the layer of hard mask material exposing portions of the second layer of an interlayer dielectric;

(h) removing the first layer of photoresist;

(i) forming a second layer of photoresist on the hard mask layer and exposed portions of second layer of interlayer dielectric;

(j) removing portions of the second layer of photoresist exposing portions of the second layer of interlayer dielectric under which combination conductive wires and vias are to be formed;

(k) anisotropically etching the exposed portions of the second layer of interlayer dielectric in which combination conductive wire and vias are to be formed exposing portions of the etch stop layer under which conductive vias are to be formed;

(l) anisotropically etching the exposed portions of the etch stop layer under which conductive vias are to be formed;

(m) removing the second layer of photoresist exposing portions of the second layer of interlayer dielectric in which conductive lines are to be formed and exposing portions of the first layer of interlayer dielectric in which combination conductive lines and vias are to be formed;

(n) simultaneously anisotropically etching the exposed portions of the first layer of interlayer dielectric forming cavities for combination wire and vias and anisotropically etching the exposed portions of the second layer of interlayer dielectric forming cavities for conductive wires; and (m) simultaneously filling the cavities with a conductive material.

2. The method of claim 1 wherein the first layer of photoresist is patterned with a dimension X that is a dimension of the conductive lines and conductive vias.

3. The method of claim 2 wherein the second layer of photoresist is patterned with a dimension X+a.

4. The method of claim 3 wherein the dimension "a" is selected to compensate for a misalignment of the first layer of photoresist with the second layer of photoresist and to compensate for rounding of corners of etched portions of the stop layer, wherein the etched portions of the stop layer have a rectangular cross-section providing a maximum cross-sectional interface between a conductive line and a conductive via.

* * * * *